United States Patent
Kumath et al.

(10) Patent No.: US 11,972,675 B2
(45) Date of Patent: Apr. 30, 2024

(54) IN-SITU SILENT FAULT DETECTION FOR BUZZERS

(71) Applicant: Renesas Electronics America Inc., Milpitas, CA (US)

(72) Inventors: Lokesh Kumath, Cary, NC (US); Muthukumaran Chandrasekaran, San Jose, CA (US); Harley Franklin Burger, Jr., San Jose, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 198 days.

(21) Appl. No.: 17/745,990

(22) Filed: May 17, 2022

(65) Prior Publication Data
US 2023/0419818 A1 Dec. 28, 2023

(51) Int. Cl.
*G08B 29/00* (2006.01)
*G01R 31/56* (2020.01)
*G08B 3/00* (2006.01)

(52) U.S. Cl.
CPC ............ *G08B 29/00* (2013.01); *G01R 31/56* (2020.01); *G08B 3/00* (2013.01)

(58) Field of Classification Search
CPC ........... G08B 29/00; G08B 3/00; G01R 31/56
See application file for complete search history.

(56) References Cited

U.S. PATENT DOCUMENTS

| | | | |
|---|---|---|---|
| 9,424,886 B1* | 8/2016 | Ma | G11B 33/144 |
| 2003/0048587 A1* | 3/2003 | Lai | H02H 3/04 |
| | | | 361/42 |
| 2013/0112153 A1* | 5/2013 | So | A01K 15/021 |
| | | | 119/720 |
| 2021/0075384 A1* | 3/2021 | Cheng | H03F 3/2175 |

* cited by examiner

*Primary Examiner* — Dominic E Hawkins
(74) *Attorney, Agent, or Firm* — SCULLY, SCOTT, MURPHY & PRESSER, P.C.

(57) ABSTRACT

In an embodiment, a semiconductor device is disclosed. The semiconductor device includes a plurality of output pins. Each of the output pins is electrically connected to an input pin of a buzzer and to a buzzer driver. The buzzer driver is configured to cause the buzzer to emit an audible sound. The semiconductor device further includes a plurality of ground switches. Each ground switch is configured to connect a corresponding output pin of the plurality of output pins to ground when closed. The semiconductor device further includes a current generator that is configured to supply a test current to a given output pin of the plurality of output pins and a clamp switch that is configured to connect the given output pin to an analog-to-digital converter.

20 Claims, 3 Drawing Sheets

IN-SITU SILENT FAULT DETECTION FOR BUZZERS

BACKGROUND OF THE SPECIFICATION

The present disclosure relates in general to fault detection for buzzers and in some embodiments to fault detection for piezo buzzers.

Buzzers are used as an audible warning indicator in many electronics systems, including, e.g., smoke and carbon monoxide (CO) detection systems, other hazard detection systems or detection systems that are configured to detect and monitor any other type of condition. For hazard detection systems in particular it is often critical for the buzzer to function properly throughout the life of the system to reliably alert users of a potentially hazardous condition. Many regulations often require hazard detection systems such as, e.g., smoke/CO detection systems, to implement periodic fault testing of the buzzer to ensure that the buzzer is functioning properly. However, the regulations also often require that the fault testing does not cause the buzzer to generate an audible sound in order to avoid a false alarm condition. Performing such fault testing to confirm that a buzzer is functioning properly without causing the buzzer to generate an audible sound may be challenging.

SUMMARY

In an embodiment, a semiconductor device is disclosed. The semiconductor device comprises a plurality of output pins. Each of the output pins is electrically connected to an input pin of a buzzer and to a buzzer driver. The buzzer driver is configured to cause the buzzer to emit an audible sound. The semiconductor device further comprises a plurality of ground switches. Each ground switch is configured to connect a corresponding output pin of the plurality of output pins to ground when closed. The semiconductor device further comprises a current generator that is configured to supply a test current to a given output pin of the plurality of output pins and a clamp switch that is configured to connect the given output pin to an analog-to-digital converter.

In another embodiment, a method performed by at least one processor comprising hardware is disclosed. The method comprises disabling a buzzer driver of a detection system. The buzzer driver is connected with a buzzer via a plurality of output pins. The method further comprises performing a pretest reset process. The pretest reset process comprises connecting the plurality of output pins to ground. The method further comprises configuring the detection system for performance of a fault test process by disconnecting a given output pin of the plurality of output pins from ground and configuring a current generator of the detection system to generate a test current. The method further comprises performing the fault test process by activating the current generator to generate the test current, deactivating the current generator after a predetermined amount of time, initiating analog-to-digital conversion by an analog-to-digital converter connected to the buzzer via the given output pin to generate count values and storing the count values from the analog-to-digital conversion in memory. The method further comprises comparing the stored count values to factory stored values corresponding to a prior performance of the fault test process, determining, based at least in part on the comparison, that a fault condition has occurred and triggering an alert based at least in part on the determination that a fault condition has occurred.

In another embodiment, an apparatus comprising at least one processing device comprising hardware is disclosed. The at least one processing device is configured to disable a buzzer driver of a detection system. The buzzer driver being connected with a buzzer via a plurality of output pins. The at least one processing device is further configured to perform a pretest reset process. The pretest reset process comprises connecting the plurality of output pins to ground. The at least one processing device is further configured to configure the detection system for performance of a fault test process by disconnecting a given output pin of the plurality of output pins from ground and configuring a current generator of the detection system to generate a test current. The at least one processing device is further configured to perform the fault test process by activating the current generator to generate the test current, deactivating the current generator after a predetermined amount of time, initiating analog-to-digital conversion by an analog-to-digital converter connected to the buzzer via the given output pin to generate count values and storing the count values from the analog-to-digital conversion in memory. The at least one processing device is further configured to compare the stored count values to factory stored values corresponding to a prior performance of the fault test process, determine, based at least in part on the comparison, that a fault condition has occurred and trigger an alert based at least in part on the determination that a fault condition has occurred.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

Figure 1:
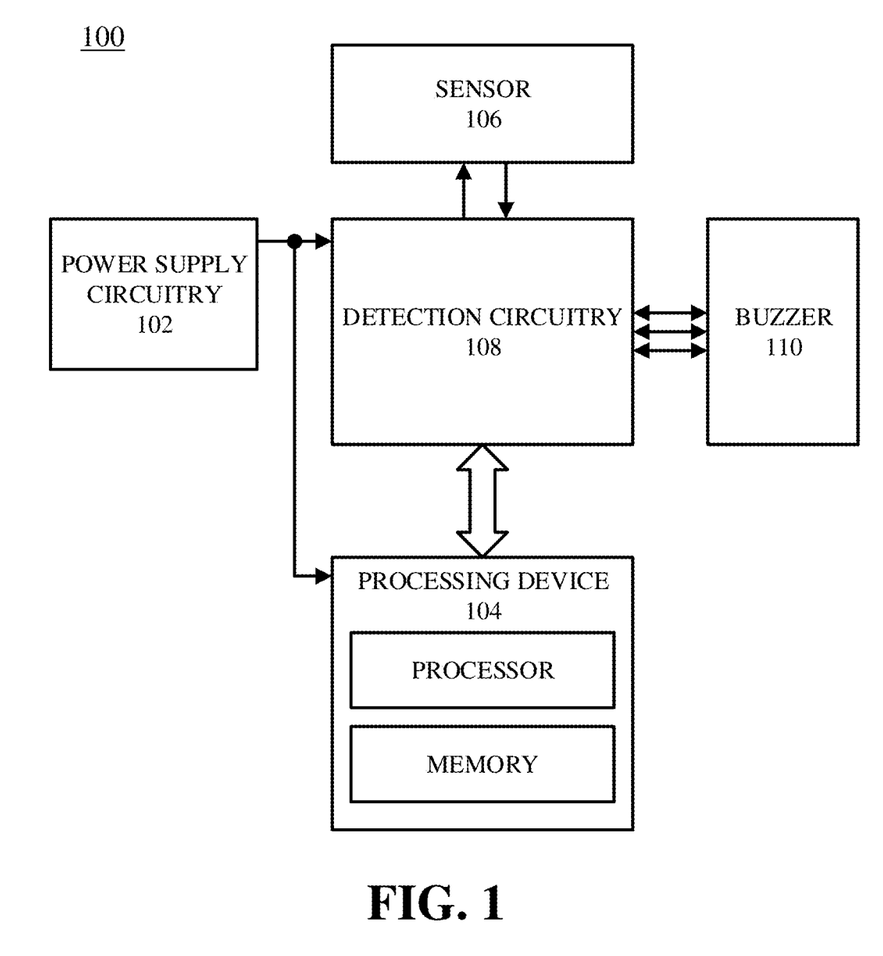
FIG. 1 is a system diagram of an example detection system according to an embodiment.

With reference to FIG. 1, an example detection system 100 is illustrated. Detection system 100 comprises a power supply circuitry 102, a processing device 104, a sensor 106, detection circuitry 108 and a buzzer 110. In some embodiments, detection system 100 comprises a smoke/CO detection system although detection system 100 may comprise additional or alternative types of detection systems in other embodiments such as, e.g., a temperature detections system, a pressure detection system, a radiation detection system, a laser detection system, a chemical detection system, network detection system or any other detection system.

Power supply circuitry 102 comprises power management circuitry or any other circuitry utilized in a conventional power supply to support a battery power supply, a wired power supply, both battery and wired power supplies or any other type of power supply.

Processing device 104 comprises, for example, a processor, a microcontroller, a central processing unit (CPU), microcontroller unit (MCU), field-programmable gate array (FPGA), application-specific integrated circuit (ASIC) or any other circuitry for processing information. Processing device 104 also comprises memory such as, e.g., registers, cache, random-access memory (RAM), read-only memory (ROM), non-volatile memory, volatile memory or any other type of memory. In some embodiments, processor 104 may be part of detection circuitry 108.

Sensor 106 may comprise any sensor that is configured to sense and monitor a condition. As an example, sensor 106 may comprise a smoke sensor, CO sensor, temperature sensor, pressure sensor, radiation sensor, any other sensor depending on the condition to be monitored or any combination thereof.

Figure 2:
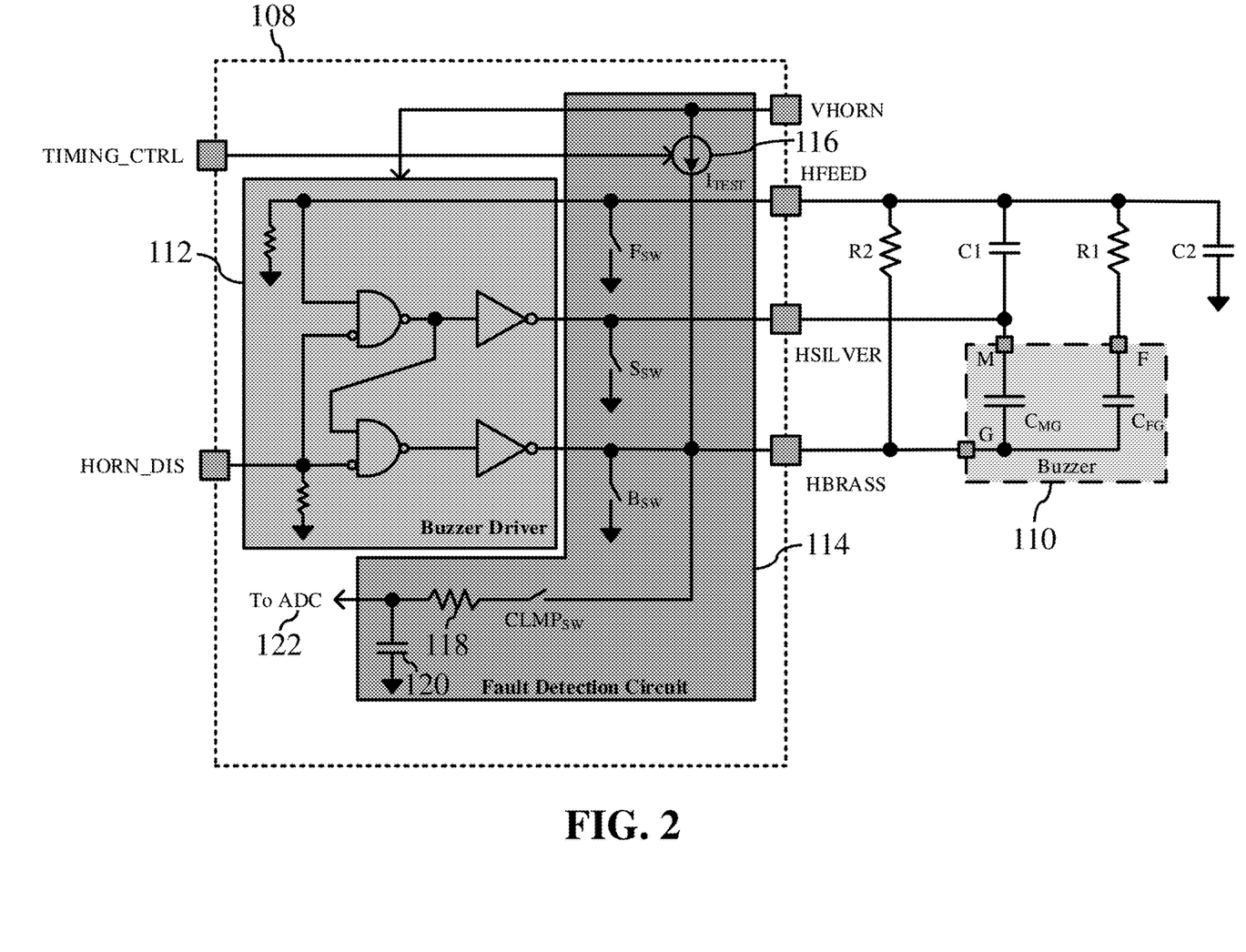
FIG. 2 is a circuit diagram illustrating example fault detection circuitry of the detection system of FIG. 1 according to an embodiment.

Detection circuitry 108 comprises circuitry that is configured to perform various functions in detection system 100. For the sake of brevity only those components and circuitry relevant to the illustrative embodiments are shown in FIGS. 1 and 2. For example, detection circuitry 108 may comprise circuitry to process signals received from sensor 106, circuitry to determine whether or not to activate buzzer 110, circuitry to communicate with processing device 104, an analog-to-digital converter (ADC) or any other circuitry or components commonly found in a detection system such as, e.g., a smoke/CO detection system or other detection system.

With reference also to FIG. 2, detection circuitry 108 further comprises pins VHORN, TIMING_CTRL, HORN_DIS, HFEED, HSILVER and HBRASS, a buzzer driver 112 and a fault detection circuit 114. In some embodiments, detection circuitry 108 may be a single integrated circuit comprising all of the circuitry and components mentioned above. In other embodiments some or all of the circuitry and components mentioned above may have their own integrated circuits. As an example, buzzer driver 112 and fault detection circuit 114 may be formed as part of the same integrated circuit or each may be part of a different integrated circuit.

HORN_DIS is a logic input pin which when pulled high disables buzzer driver 112. HORN_DIS may be controlled by processing device 104 or another processing device or circuitry of detection system 100. In some embodiments, pulling HORN_DIS low may alternatively disable buzzer driver 112. In some embodiments, HORN_DIS may be replaced by a register bit controlled by processing device 104 to activate or disable buzzer driver 112.

TIMING_CTRL is a logic input pin which controls timing for current generator 116 during testing of the buzzer fault conditions. In some embodiments, TIMING_CTRL may be replaced by a register bit controlled by processing device 104 for controlling current generator 116.

VHORN is a power supply pin for buzzer driver 112 and fault detection circuit 114.

HFEED connects to feedback pin (F) of buzzer 110. In an embodiment where a two-pin buzzer is utilized, HFEED may also or alternatively connect to a ground pin of buzzer 110.

HSILVER connects to a main pin (M) of buzzer 110.

HBRASS connects to a ground pin (G) of buzzer 110.

Buzzer 110 comprises circuitry that is configured to emit a sound audible to human hearing in response to signals received from detection circuitry 108. An example buzzer 110 according to an illustrative embodiment is shown in FIG. 2. For example, as seen in FIG. 2, buzzer 110 comprises pins M, F and G, and capacitors, $C_{MG}$ and $C_{FG}$. In other embodiments, a buzzer 110 comprising a greater or smaller number of pins, a greater or smaller number of capacitors or having any other configuration of pins, capacitors or other components may alternatively be utilized. In an illustrative embodiment, buzzer 110 as shown in FIG. 2 comprises a piezo buzzer. In other embodiments, any other type of buzzer 110 that is electrically driven by a buzzer driver 112 may be utilized and tested, e.g., a magnetic buzzer or any other type of buzzer.

With continued reference to FIG. 2, detection system 100 comprises external components connecting detection circuitry 108 with buzzer 110. For example, in the embodiment shown in FIG. 2, the external components such as, e.g., resistors R1 and R2 and capacitors C1 and C2, are connected to pins HFEED, HSILVER and HBRASS of detection circuitry 108 and pins M, F and G of buzzer 110. In other embodiments, any other configuration of external components may also or alternatively be included depending on the type of buzzer 110 and the corresponding required connections.

Buzzer driver 112 comprises circuitry that is configured to drive buzzer 110 to emit an audible sound in response to a detection of a target condition. For example, in the case of a smoke/CO detector, the detection of smoke or CO above a threshold level may cause buzzer driver 112 to drive buzzer 110 to emit the sound, e.g., due to HORN_DIS being pulled low to enable buzzer driver 112. Buzzer driver 112 receives VHORN as a power supply input and HORN_DIS as a signal input and outputs to HFEED, HSILVER and HBRASS to drive buzzer 110. For example, in some embodiments, buzzer driver 112 comprises circuitry such as, e.g., logic gates, inverters, or other circuitry, which is configured to drive buzzer 110 to emit the audible sound in response to a signal received at HORN_DIS, e.g., from processing device 104. In some embodiments, a greater or smaller number of output pins may be utilized. For example, in a case where buzzer 110 only includes two pins, buzzer driver 112 may also output to two pins.

Fault detection circuit 114 comprises a current generator 116, switches $F_{SW}$, $S_{SW}$, $B_{SW}$ and $CLMP_{SW}$, a resistor 118 and a capacitor 120. Fault detection circuit 114 receives VHORN as a power supply for current generator 116 and TIMING_CTRL as an input that controls current generator 116 to generate a test current $I_{TEST}$. Fault detection circuit outputs to an ADC 122. Switch $F_{SW}$ connects HFEED to ground when closed, switch $S_{SW}$ connects HSILVER to ground when closed, switch $B_{SW}$ connects HBRASS to ground when closed and switch $CLMP_{SW}$ connects current generator 116 and HBRASS to ADC 122 via resistor 118 when closed. In some embodiments ADC 122 is part of detection circuitry 108. In other embodiments, ADC 122 may be external to detection circuitry 108. ADC 122 is configured to provide a digital output to processing device 104 based on the output of fault detection circuit 114. In some embodiments, ADC 122 may alternatively comprise resistor 118, capacitor 120 and CLMPSW such that HBRASS is directly connected an ADC 122.

Current generator 116 is comprises a programmable current source that is configured to convert a voltage received from VHORN into current $I_{TEST}$. In some embodiments, current generator 116 may be configured to output $I_{TEST}$ at a current value that is based on the particular characteristics of buzzer 110. For example, depending on the characteristics of buzzer 110, a larger or smaller current value may be output for $I_{TEST}$.

Switches $F_{SW}$, $S_{SW}$, $B_{SW}$ and $CLMP_{SW}$ comprise switches that have a resistance value even when closed. For example, in some embodiments, some or all of switches $F_{SW}$, $S_{SW}$, $B_{SW}$ and $CLMP_{SW}$ may comprise transistors such as, e.g., metal-oxide-semiconductor (MOS) transistors, MOS field-effect transistors (MOSFET) or other types of transistors. In some embodiments, for example, switches $F_{SW}$, $S_{SW}$, $B_{SW}$ and $CLMP_{SW}$ may comprise complementary MOS (CMOS) switches. Switches $F_{SW}$, $S_{SW}$, $B_{SW}$ and $CLMP_{SW}$ may comprise P-type transistors, N-type transistors or a combination of P-type and N-type transistors. In some embodiments, switches $F_{SW}$, $S_{SW}$, $B_{SW}$ and $CLMP_{SW}$ may comprise P or N type polysilicon or Well resistors. In some embodiments, switches $F_{SW}$, $S_{SW}$, $B_{SW}$ and $CLMP_{SW}$ may comprise a combination of any of the above-mentioned types of resistors or transistors and may also comprise parallel current sources that enable a controlled discharge during a preset reset process.

In some embodiments, the resistance values of some or all of switches $F_{SW}$, $S_{SW}$, $B_{SW}$ and $CLMP_{SW}$ may be programmable, e.g., based on the characteristics of buzzer 110. For example, the resistance values of some or all of switches $F_{SW}$, $S_{SW}$, $B_{SW}$ and $CLMP_{SW}$ may be programmable to resistance values that are sufficient to inhibit buzzer 110 from emitting an audible sound when capacitors $C_{MG}$ and $C_{FG}$ of buzzer 110 are discharged to ground or to ADC 122. As an example, both the maximum voltage that the buzzer pin is charged to as well as how fast the buzzer pin is discharged (or charged) determine if buzzer 110 will make an audible sound. In the case of a buzzer 110 having a $C_{MG}$ with a maximum capacitance of 25 nF, a discharge rate smaller than or equal to 40 mV/ms may be sufficient to not emit an audible sound. Other discharging rates may alternatively be used depending on characteristics of the particular buzzer 110 that is utilized. In an example scenario, a switch resistance of 66.6K ohms may be utilized during the preset reset process to discharge a $C_{MG}$ having a maximum capacitance of 25 nF from 200 mV to 0V in about 5 ms to meet the above rate of 40 mV/ms. In some embodiments the resistance values of some or all of switches $F_{SW}$, $S_{SW}$, $B_{SW}$ and $CLMP_{SW}$ may be determined based on the capacitance characteristics of capacitors $C_{MG}$ and $C_{FG}$ of buzzer 110. In this manner, fault detection circuit 114 may be configured to function with a variety of types of buzzers 110 having different capacitance characteristics.

Buzzer fault conditions occur when the buzzer 110 is not functioning properly. Some example fault conditions are presented in table 1, below:

TABLE 1

| Buzzer Fault Conditions | Comments |
| --- | --- |
| Open circuit conditions | |
| G open, M open, F open | Buzzer is removed, or one or more of its wires are open. |
| Short circuit conditions | |
| G shorted to M, G shorted to F, M shorted to F. | Buzzer wires are shorted to each other. |
| G shorted to GND/Supply, M shorted to GND/Supply, HFEED shorted to GND/Supply, F shorted to GND/Supply. | Buzzer wires are shorted to GND or supply. |
| G shorted to HFEED, M shorted to HFEED, F shorted to HFEED. | This condition may happen if one or more of external components e.g., R1, R2, C1 or C2, become faulty. |
| Power supply fault | |
| VHORN supply not powered-up or is disconnected. | VHORN must be powered-up for driver to drive the buzzer. |

As an example, a fault condition may occur if buzzer 110 is removed from the detection system, if any of connections F, M and G of buzzer 110 have a short circuit, if VHORN is disconnected from buzzer 110 or is not powered up, if buzzer driver 112 or other external components of detection system 100 such as R1, R2, C1 or C2 have a short circuit condition or other fault, or if any other fault conditions typically associated with a buzzer occur. Any of these fault conditions may render buzzer 110 unable to perform as required, e.g., by being unable to emit an audible sound or reducing the sound output to a level below that recommended by the regulations.

The presence of a fault condition may be communicated internally and externally to detection system 100 or another device using a variety of methods including, e.g., by causing light emitting diodes (LEDs) to flash, by transmitting a wired or wireless message indicating the presence of a fault to another component of the detection system or in any other manner. For example, in some cases, the method of communicating the presence of a fault condition may depend on the requirements of any relevant regulation associated with the detection system.

In an illustrative embodiment, in-situ silent buzzer fault detection may be performed by utilizing indirect measurement of the capacitances $C_{MG}$ and $C_{FG}$ between the M-G and F-G pins of buzzer 110. As an example, in some embodiments, $C_{MG}$ may have a capacitance of around 25 nanofarads (nF) during normal operation while $C_{FG}$ may have a capacitance of around 3 nF. The particular capacitance values during normal operation for each buzzer may vary and may depend on the manufacturer, type or other characteristics of the buzzer. An indirect measurement of the capacitance values $C_{MG}$ and $C_{FG}$ of buzzer 110 may be taken in the factory prior to deployment or sale of buzzer 110 or detection system 100 and stored for later use, e.g., in memory of detection circuitry 108, in memory associated with processing device 104 or in another location. The factory stored values may then be compared to indirect capacitance measurements performed at a later time, e.g., using processing device 104 or a firmware computing algorithm installed on detection circuitry 108, to determine if buzzer 110 is faulty.

In performing such indirect capacitance measurements, a number of challenges need to be overcome. For example, in performing in-situ measurements at the location where buzzer 110 is actually in use, buzzer 110 cannot be physically removed to perform the measurement. Because of this, the external components such as R1, R2, C1 and C2, and any other component connected to buzzer driver 112 must be taken into account including connections to buzzer driver 112.

Disconnecting buzzer 110 using external switches may add cost to detection system 100 while using in-line switches in detection circuitry 108 to disconnect buzzer 110 may require large high voltage switches which add cost or take up significant space on the semiconductor device(s). Such in-line switches may also require additional pins for a complete electrical isolation of buzzer 110.

In addition, during testing, regulations may require that buzzer 110 not produce any audible sound while the capacitances $C_{MG}$ and $C_{FG}$ are being measured which may be difficult if the capacitors are charged or drained too quickly.

In illustrative embodiments, the capacitance measurements are performed indirectly, in-situ, without disconnecting buzzer 110 from buzzer driver 112 electrically or physically, thereby avoiding the need for additional high voltage switches inside or outside of detection circuitry 108. For example, fault detection may be performed by sourcing a known and programmable current $I_{TEST}$ into HBRASS. The current source is turned on for a fixed duration controlled by TIMING_CTRL. The developed voltage on HBRASS due to the capacitors $C_MS$ and $C_{FG}$ is measured through ADC 122. The magnitude of the current $I_{TEST}$ and the timing for which the current $I_{TEST}$ is turned on may be carefully selected to completely avoid a sound output from the buzzer 110 during the fault detection.

In the example of a three pin buzzer 110 such as that shown in FIG. 2, two separate fault test processes, fault test process 1 and fault test process 2, may be performed as part of the fault detection as will described in more detail below. The results from these tests are stored in system memory, e.g., in memory of detection circuitry 108, in memory associated with processing device 104 or in another location, for comparison with the factory stored values of the two fault test processes previously performed during factory calibration. Other fault test processes may also or alternatively be performed.

The difference in the configuration of detection circuitry 108 in a normal operating mode and in a fault detection mode will now be described in more detail below with reference also to table 2:

TABLE 2

| Mode | $I_{TEST}$ value | $F_{SW}$ | $S_{SW}$ | $B_{SW}$ | $CLMP_{SW}$ | Driver output |
|---|---|---|---|---|---|---|
| Normal operation | 0 μA | Open | Open | Open | Open | Active (HORN_DIS = 0) |
| Pretest Reset Process | 0 μA | Closed (High R) | Closed (High R) | Closed (High R) | Closed (Low R) | High Impedance (HORN_DIS = 1) |
| Fault Test Process 1 | 1 μA | Closed (Low R) | Open | Open | Closed (Low R) | High impedance (HORN_DIS = 1) |
| Fault Test Process 2 | 7.5 μA | Closed (Low R) | Closed (Low R) | Open | Closed (Low R) | High impedance (HORN_DIS = 1) |

In the normal operating mode, the current generator 116 is turned off and switches $F_{SW}$, $S_{SW}$, $B_{SW}$ and $CLMP_{SW}$ are all open. Buzzer driver 112 is active and drives the HSILVER and HBRASS if HORN_DIS is held low. Buzzer driver 112 also receives a feedback signal from buzzer 110 via HFEED. No testing is performed during the normal operating mode and detection circuitry 108 is configured to cause buzzer 110 to emit an audible sound in the event that a condition such as, e.g., a hazardous condition, occurs.

In the fault detection mode, a pretest reset process is applied one or more times by fault detection circuit 114 to discharge capacitors $C_{MG}$ and $C_{FG}$ of buzzer 110 to ground via HFEED, HSILVER and HBRASS and fault test processes are performed.

During the pretest reset process, switches $F_{SW}$, $S_{SW}$, and $B_{SW}$ are closed to discharge capacitors $C_{MG}$ and $C_{FG}$ to ground via HFEED, HSILVER and HBRASS and buzzer driver 112 is disabled, e.g., by setting HORN_DIS to high, and its output drivers are set to high impedance. Each of switches $F_{SW}$, $S_{SW}$, and $B_{SW}$ is configured to have a high resistance value during the pretest reset process, also referred to as high R, where the resistance value may depend on the maximum capacitance of capacitors $C_{MG}$ and $C_{FG}$ or a target discharge rate. For example, in some embodiments, the resistance of switches $F_{SW}$, $S_{SW}$, and $B_{SW}$ is large enough to slowly discharge capacitors $C_{MG}$ and $C_{FG}$ to ground via HFEED, HSILVER and HBRASS at a low enough rate that the emission of sound from buzzer 110 during the pretest reset process is inhibited. In one example embodiment, the high R resistance of each switch $F_{SW}$, $S_{SW}$, and $B_{SW}$ may be 66K ohms based on capacitance values of 25 nF and 3 nF for capacitors $C_{MG}$ and $C_{FG}$ as mentioned above. In other embodiments, switches $F_{SW}$, $S_{SW}$, and $B_{SW}$ may have other resistance values. In some embodiments, switches $F_{SW}$, $S_{SW}$, and $B_{SW}$ may have programmable resistance such that fault detection circuit 114 may be utilized with different types of buzzers 110 having capacitors with different capacitance values. In some embodiments, switches $F_{SW}$, $S_{SW}$, and $B_{SW}$ may also be replaced with a programmable current source that may be utilized to better control the discharge of buzzer 110.

In some embodiments, switch $CLMP_{SW}$ may also be closed during the pretest reset process. For example switch $CLMP_{SW}$ may be closed with a low resistance value, also referred to as low R that allows capacitor 120 to discharge to ground. In some embodiments, low R may have a value of 100 ohms. Other values of low R may alternatively be utilized. In some embodiments ADC 122 may be active during the pretest reset process to monitor the discharge of capacitors $C_{MG}$ and $C_{FG}$ and determine when discharging is complete.

Once capacitors $C_{MG}$ and $C_{FG}$ have been discharged, one of the fault test processes, e.g., fault test process 1 or fault test process 2 may be performed. For example, in some embodiments, the pretest reset process may be performed before each fault test process. While only two fault test processes are described, any other fault test processes may also or alternatively be performed.

During the fault test processes, current generator 116 is activated with a value corresponding to which test is being performed. The value of $I_{TEST}$ is programmable based on which fault test process is being performed and based on the characteristics of the particular buzzer 110 being tested. The exact value of $I_{TEST}$ for each fault test process may be predetermined during the design of detection system 100, during factory calibration of detection system 100 or in any other manner.

During fault test process 1, switches $F_{SW}$ and $CLMP_{SW}$ are closed while switches $S_{SW}$ and $B_{SW}$ are left open. In fault test process 1 switches $F_{SW}$, $S_{SW}$, $B_{SW}$, $CLMP_{SW}$ all have low resistance (low R) when closed, e.g., 100Ω or another low resistance value. Buzzer driver 112 is disabled, e.g., by setting HORN_DIS to high, and its output drivers are set to high impedance. Current generator 116 generates current $I_{TEST}$ at a first current value which is utilized to charge up capacitors $C_{MG}$ and $C_{FG}$ for a predetermined amount of time. As an example, during fault test process 1, the first current value of $I_{TEST}$ may have a value of 1 μA for a predetermined time of 5 ms. Other values of $I_{TEST}$ may alternatively be used for fault test process 1.

During fault test process 2, switches $F_{SW}$, $S_{SW}$ and $CLMP_{SW}$ are closed while switch $B_{SW}$ is left open. In fault test process 2 switches $F_{SW}$, $S_{SW}$, $B_{SW}$, $CLMP_{SW}$ all have low resistance (low R) when closed, e.g., 100Ω or another low resistance value. Buzzer driver 112 is disabled, e.g., by setting HORN_DIS to high, and its output drivers are set to high impedance. Current generator 116 generates current $I_{TEST}$ at a second current value which is utilized to charge up capacitors $C_MG$ and $C_{FG}$ for a predetermined amount of time. As an example, during fault test process 2, the second current value of $I_{TEST}$ may have a value of 7.5 μA for a predetermined time of 5 ms. Other values of $I_{TEST}$ may alternatively be used for fault test process 2.

Fault tests processes 1 and 2 are designed by carefully selecting the value of $I_{TEST}$ and the amount of time that $I_{TEST}$ is generated such that the rate of change in voltage on HBRASS is sufficiently slow so as to not cause buzzer 110 to emit an audible sound. During either fault test process, current $I_{TEST}$ is configured to cause HBRASS to develop a voltage that is smaller than that needed by buzzer 110 to emit an audible sound, e.g., approximately 200 mV in the embodiment of buzzer 110 described above. When performing fault testing processes on other buzzers, other current values for $I_{TEST}$ and amounts of time may be utilized based on the characteristics of those other buzzers. By limiting the amount of energy supplied to buzzer 110 and the amount of time that the energy is supplied during the fault test processes, the emission of any audible sound output from the buzzer 110 is inhibited.

In some embodiments, fault test process 1 and fault test process 2 may be initiated by processing device 104 or other processing circuitry of detection system 100, e.g., by writing to a test configuration register of detection circuitry 108 after HORN_DIS is pulled high to disable buzzer driver 112.

Figure 3:
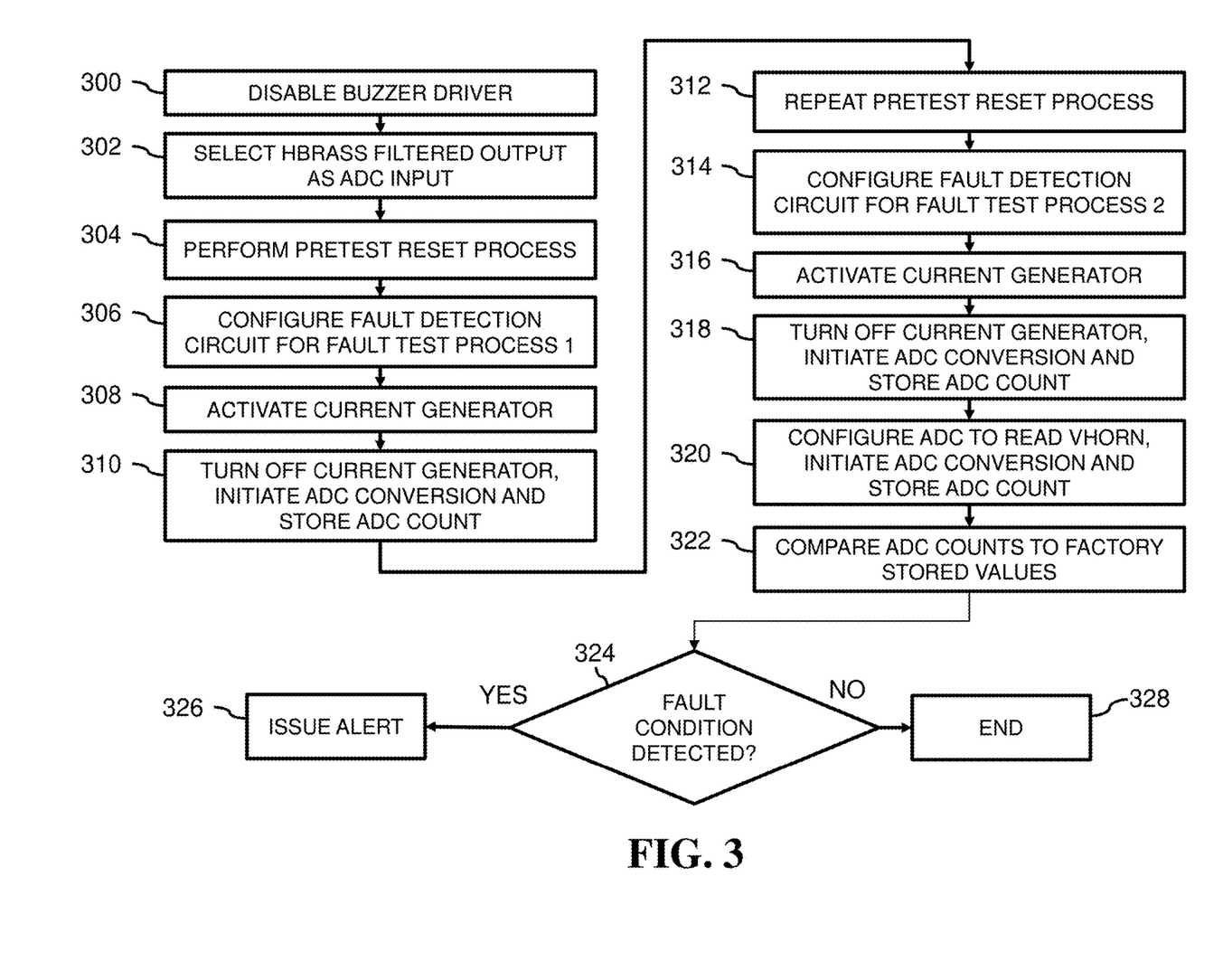
FIG. 3 is a flow diagram of an example fault detection process according to an embodiment.

With reference now to FIG. 3 an example fault detection process will now be described. The process of FIG. 3 comprises steps 300 through 328.

At step 300, processing device 104 commands detection circuitry 108 to disable buzzer driver 112, e.g., by pulling HORN_DIS high (if it was low).

At step 302, processing device 104 commands ADC 122 to select the HBRASS filtered output, e.g., the output from HBRASS via switch $CLMP_{SW}$ and resistor 118, as the ADC input.

At step 304, processing device 104 commands detection circuitry 108, e.g., using a serial communication or another communication method, to cause fault detection circuit 114 to perform the pretest reset process on HFEED, HSILVER and HBRASS. As mentioned above, the pretest reset process resets the voltage on the pins M, F and G of buzzer 110 by discharging them and capacitors $C_{MG}$ and $C_{FG}$ to ground. The switch resistance of switches $F_{SW}$, $S_{SW}$ and $B_{SW}$ are configured with high R values to discharge capacitors $C_{MG}$ and $C_{FG}$ very slowly such that the emission of any audible sound by buzzer 110 during the pretest reset process is inhibited.

At step 306, processing device 104 commands detection circuitry 108 to configure fault detection circuit 114 for fault test process 1. As mentioned above, fault test process 1 configures $I_{TEST}$ to the first current value, e.g., 1 µA, and closes switches $F_{SW}$ and $CLMP_{SW}$ with low R while switches $S_{SW}$ and $B_{SW}$ remain open. As mentioned above, alternative current values may be utilized for the first current value of $I_{TEST}$ depending on the characteristics of the particular buzzer type and manufacturer.

At step 308, processing device 104 commands detection circuitry 108 to pull TIMING_CTRL high to activate current generator and initiate fault test process 1. Processing device 104 keeps TIMING_CTRL high for a predetermined amount of time, e.g., 5 ms in the example embodiment. Any other predetermined amount of time may be utilized. For example, the predetermined amount of time may be determined based on the buzzer type and manufacturer. While described as pulling TIMING_CTRL high to initiate fault test process 1, fault test process 1 may alternatively be initiated by pulling TIMING_CTRL low in other embodiments.

At step 310, processing device 104 commands detection circuitry 108 to pull TIMING_CTRL low to turn off current generator 116 and initiates an ADC conversion on the falling edge of TIMING_CTRL. Processing device 104 reads the ADC output count and stores it in a memory location such as, e.g., a register or other memory location. In some embodiments, multiple ADC conversions may be initiated to average out the data and reduce the impact from random noise. While described as pulling TIMING_CTRL low to turn off current generator 116, generator may alternatively be turned off by pulling TIMING_CTRL high in other embodiments.

At step 312, processing device 104 commands detection circuitry 108 to repeat the pretest reset process.

At step 314, processing device 104 commands detection circuitry 108 to configure fault detection circuit 114 for fault test process 2. As mentioned above, fault test process 2 configures $I_{TEST}$ to 7.5 µA and closes switches $F_{SW}$, $S_{SW}$ and $CLMP_{SW}$ with low R while switch $B_{SW}$ remains open. As mentioned above, alternative current values may be utilized for $I_{TEST}$ depending on the characteristics of the particular buzzer type and manufacturer.

At step 316, processing device 104 commands detection circuitry 108 to pull TIMING_CTRL high to initiate fault test process 2. TIMING_CTRL activates current generator 116. Processing device 104 keeps TIMING_CTRL high for a predetermined amount of time, e.g., 5 ms in the example embodiment. Any other predetermined amount of time may be utilized. For example, the predetermined amount of time may be determined based on the buzzer type and manufacturer.

At step 318, processing device 104 commands detection circuitry 108 to pull TIMING_CTRL low to turn off current generator 116 and initiates an ADC conversion on the falling edge of TIMING_CTRL. Processing device 104 reads the ADC output count and stores it in a memory location such as, e.g., a register or other memory location. In some embodiments, multiple ADC conversions may be initiated to average out the data and reduce the impact from random noise.

At step 320, processing device 104 configures the ADC to read VHORN power supply level and initiates an ADC conversion. Processing device 104 reads the ADC output count and stores it in a memory location such as, e.g., a register or other memory location. In some embodiments, multiple ADC conversions may be initiated to average out the data and reduce the impact from random noise.

At step 322, processing device 104 compares the ADC counts from steps 310, 318 and 320 with the factory stored values of ADC counts from prior fault test processes 1 and 2 and from prior VHORN power supply level tests that were performed during factory calibration.

At step 324, processing device 104 determines, e.g., based on a firmware or software algorithm, whether or not the ADC counts are within an acceptable range of the factory stored values for each test. If any of the counts are outside the acceptable range, processing device 104 determines that buzzer 110 has a fault condition and issues an alert at step 326. As an example, the alert may comprise causing LEDs of the detection system 100 to blink, transmitting a fault signal such as, e.g., a radio signal, to a device of a user, or any other form of alert. If each of the ADC counts is within the acceptable range of its corresponding factory stored value, the process ends at step 328.

Example results of ADC counts for some fault conditions are shown below in table 3:

TABLE 3

| Buzzer condition | Fault test process 1 ADC counts | Fault test process 2 ADC counts | Comments |
|---|---|---|---|
| Normal buzzer | 65 | 84 | Factory stored values. |
| Faulty buzzer condition | | | |
| G open | 199 | 1023 | Fault test process values significantly off from factory stored values. |
| M open | 81 | 605 | Fault test process 2 value significantly off from factory stored value. |
| F open | 136 | 91 | Test1 value significantly off from factory stored value. |
| G shorted to M | 65 | 2 | Test2 value significantly off from factory stored value. |
| G shorted to F | 41 | 81 | Test1 value 24 counts less. |
| M shorted to F | 48 | 91 | Test1 value 17 counts less. |

As seen in table 3, a significant difference between the factory stored values and the ADC counts for either of the fault test processes or the VHORN power supply level indicates that there is a fault condition for buzzer 110. In some embodiments, the acceptable range may be based on a minimum threshold value and a maximum threshold value for each factory stored value. As an example, in some embodiments, if the ADC count is 30% greater than or less than the corresponding factory stored value, processing device 104 may determine that a fault condition is present. Any other % value above or below the factory stored value may alternatively be utilized including 10%, 20%, 40%, 50% or any other percentage. In some embodiments, the maximum threshold value and the minimum threshold value may be different. For example, the maximum threshold value may be 30% greater than the factory stored value while the minimum threshold value may be 20% less than the factory stored value. In some embodiments, a number of counts greater than or less than the factory stored values may alternatively be utilized, e.g., 5 counts, 10 counts, 15 counts, or any other number of counts.

While the above example process is described as having particular steps or steps in a particular order, in other embodiments only some of the steps may be performed or the steps may be performed in any other order.

The illustrative embodiments provide circuitry and processes that are configured to perform fault testing on a buzzer in-situ without removal of the buzzer in a manner that inhibits the buzzer from emitting an audible sound. By providing silent fault testing in-situ, false alarms of potentially hazardous conditions may be avoided while ensuring that the buzzer is functioning properly in the event that an actual hazardous condition occurs.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A semiconductor device comprising:
    a plurality of output pins, each of the output pins being electrically connected to an input pin of a buzzer and to a buzzer driver, the buzzer driver being configured to cause the buzzer to emit an audible sound;
    a plurality of ground switches, each ground switch being configured to connect a corresponding output pin of the plurality of output pins to ground when closed;
    a current generator that is configured to supply a test current to a given output pin of the plurality of output pins; and
    a clamp switch that is configured to connect the given output pin to an analog-to-digital converter.

2. The semiconductor device of claim 1, wherein the current generator comprises a programmable current generator that is configured to supply the test current to the given output pin at least at a first current value and a second current value.

3. The semiconductor device of claim 2, wherein the first current value and the second current value are determined based at least in part on a maximum capacitance of one or more capacitors of the buzzer.

4. The semiconductor device of claim 1, wherein the plurality of ground switches each comprise a resistance value when closed, the resistance value being configured to inhibit current flow from the buzzer to ground via each corresponding output pin to a rate at which the buzzer is inhibited from emitting an audible sound.

5. The semiconductor device of claim 4, wherein at least one of the plurality of ground switches comprises a programmable resistance value.

6. The semiconductor device of claim 5, wherein the resistance value is a first resistance value, the at least one of the plurality of ground switches being programmable to have the first resistance value during a pretest reset process and a second resistance value during a fault test process, the first resistance value being larger than the second resistance value.

7. The semiconductor device of claim 6, wherein the first resistance value is determine based at least in part on a maximum capacitance of one or more capacitors of the buzzer.

8. A method performed by at least one processing device comprising hardware, the method comprising:

disabling a buzzer driver of a detection system, the buzzer driver being connected with a buzzer via a plurality of output pins;

performing a pretest reset process, the pretest reset process comprising connecting the plurality of output pins to ground;

configuring the detection system for performance of a fault test process by:
   disconnecting a given output pin of the plurality of output pins from ground; and
   configuring a current generator of the detection system to generate a test current;

performing the fault test process by:
   activating the current generator to generate the test current;
   deactivating the current generator after a predetermined amount of time;
   initiating analog-to-digital conversion by an analog-to-digital converter connected to the buzzer via the given output pin to generate count values; and
   storing the count values from the analog-to-digital conversion in a memory;

comparing the stored count values to factory stored values corresponding to a prior performance of the fault test process;

determining, based at least in part on the comparison, that a fault condition has occurred; and triggering an alert based at least in part on the determination that a fault condition has occurred.

9. The method of claim 8, wherein performing the pretest reset process comprises closing a plurality of switches of the detection system, each switch of the plurality of switches corresponding to one of the plurality of output pins and being configured to connect the corresponding one of the plurality of output pins to ground.

10. The method of claim 9, wherein the plurality of switches each comprise a resistance value when closed, the resistance value being configured to inhibit current flow from the buzzer to ground via the corresponding output pins to a rate at which the buzzer is inhibited from emitting an audible sound.

11. The method of claim 10, wherein the plurality of switches comprise programmable resistance values, the method further comprising setting the plurality of switches to the resistance value.

12. The method of claim 11, wherein:
the plurality of output pins comprise a first output pin, a second output pin and the given output pin;
the plurality of switches comprise a first switch corresponding to the first output pin, a second switch corresponding to the second output pin and a third switch corresponding to the given output pin; and
configuring the detection system for performance of the fault test process comprises:
   setting the first switch to closed;
   setting the second switch to open;
   setting the third switch to open; and
   setting a fourth switch to closed, the fourth switch being configured to connect the given output pin to the analog-to-digital converter when closed.

13. The method of claim 12, wherein:
the fault test process comprises a first fault test process;
the test current comprises a first test current; and
the method further comprises:
   configuring the detection system for performance of a second fault test process by:
      setting the first switch to closed;
      setting the second switch to closed;
      setting the third switch to open;
      setting the fourth switch to closed; and
      configuring the current generator of the detection system to generate a second test current;
   performing the second fault test process by:
      activating the current generator to generate the second test current;
      deactivating the current generator after a second predetermined amount of time;
      initiating a second analog-to-digital conversion to generate second count values; and
      storing the second count values from the second analog-to-digital conversion in a memory;
   comparing the stored second count values to factory second count values corresponding to a prior performance of the second fault test process; and
   determining, based at least in part on the comparison of the stored second count values to the factory second count values, that the fault condition has occurred.

14. The method of claim 9, wherein determining, based at least in part on the comparison, that the fault condition has occurred comprises determining that the stored count values are greater than the factory stored values by a first threshold amount or less than the factory stored values by a second threshold amount.

15. An apparatus comprising at least one processing device comprising hardware, the at least one processing device being configured to:
disable a buzzer driver of a detection system, the buzzer driver being connected with a buzzer via a plurality of output pins;
perform a pretest reset process, the pretest reset process comprising connecting the plurality of output pins to ground;
configure the detection system for performance of a fault test process by:
   disconnecting a given output pin of the plurality of output pins from ground; and
   configuring a current generator of the detection system to generate a test current;
perform the fault test process by:
   activating the current generator to generate the test current;
   deactivating the current generator after a predetermined amount of time;
   initiating analog-to-digital conversion by an analog-to-digital converter connected to the buzzer via the given output pin to generate count values; and
   storing the count values from the analog-to-digital conversion in a memory;
compare the stored count values to factory stored values corresponding to a prior performance of the fault test process;
determine, based at least in part on the comparison, that a fault condition has occurred; and
trigger an alert based at least in part on the determination that a fault condition has occurred.

16. The apparatus of claim 15, wherein performing the pretest reset process comprises closing a plurality of switches of the detection system, each switch of the plurality of switches corresponding to one of the plurality of output pins and being configured to connect the corresponding one of the plurality of output pins to ground.

17. The apparatus of claim 16, wherein the plurality of switches each comprise a resistance value when closed, the resistance value being configured to inhibit current flow from the buzzer to ground via the corresponding output pins to a rate at which the buzzer is inhibited from emitting an audible sound.

18. The apparatus of claim 17, wherein the plurality of switches comprise programmable resistance values, the at least one processing device being further configured to set the plurality of switches to the resistance value.

19. The apparatus of claim 18, wherein:
the plurality of output pins comprise a first output pin, a second output pin and the given output pin;
the plurality of switches comprise a first switch corresponding to the first output pin, a second switch corresponding to the second output pin and a third switch corresponding to the given output pin; and
configuring the detection system for performance of the fault test process comprises:
setting the first switch to closed;
setting the second switch to open;
setting the third switch to open; and
setting a fourth switch to closed, the fourth switch being configured to connect the given output pin to the analog-to-digital converter when closed.

20. The apparatus of claim 19, wherein:
the fault test process comprises a first fault test process;
the test current comprises a first test current; and
the at least one processing device is further configured to:
configure the detection system for performance of a second fault test process by:
setting the first switch to closed;
setting the second switch to closed;
setting the third switch to open;
setting the fourth switch to closed; and
configuring the current generator of the detection system to generate a second test current;
perform the second fault test process by:
activating the current generator to generate the second test current;
deactivating the current generator after a second predetermined amount of time;
initiating a second analog-to-digital conversion to generate second count values; and
storing the second count values from the second analog-to-digital conversion in a memory;
compare the stored second count values to factory second count values corresponding to a prior performance of the second fault test process; and
determine, based at least in part on the comparison of the stored second count values to the factory second count values, that the fault condition has occurred.

\* \* \* \* \*